United States Patent
Subramanian

(10) Patent No.: US 7,968,485 B2
(45) Date of Patent: Jun. 28, 2011

(54) CERAMIC POWDER, CERAMIC LAYER AND LAYER SYSTEM OF TWO PYROCHLORE PHASES AND OXIDES

(75) Inventor: Ramesh Subramanian, Oviedo, FL (US)

(73) Assignee: Siemens Aktiengesellschaft, Munich (DE)

( * ) Notice: Subject to any disclaimer, the term of this patent is extended or adjusted under 35 U.S.C. 154(b) by 537 days.

(21) Appl. No.: 12/151,424

(22) Filed: May 6, 2008

(65) Prior Publication Data

US 2010/0297410 A1    Nov. 25, 2010

Related U.S. Application Data

(60) Provisional application No. 60/928,087, filed on May 7, 2007.

(30) Foreign Application Priority Data

May 7, 2007 (EP) ..................... 07009114

(51) Int. Cl.
*C04B 35/48* (2006.01)
*C04B 35/50* (2006.01)
(52) U.S. Cl. ................ 501/103; 501/134; 501/152
(58) Field of Classification Search ............. 501/103, 501/134, 152
See application file for complete search history.

(56) References Cited

U.S. PATENT DOCUMENTS

| | | | |
|---|---|---|---|
| 6,024,792 A | 2/2000 | Bieler | |
| 7,592,071 B2 * | 9/2009 | Kaiser et al. | 428/469 |
| 7,816,293 B2 * | 10/2010 | Dudesek et al. | 501/134 |
| 2004/0106015 A1 | 6/2004 | Damani | |
| 2007/0151481 A1 * | 7/2007 | Akiyama et al. | 106/286.2 |
| 2008/0292859 A1 * | 11/2008 | Subramanian | 428/220 |
| 2009/0162648 A1 * | 6/2009 | Kaiser et al. | 428/337 |
| 2010/0009144 A1 * | 1/2010 | Schumann et al. | 428/213 |
| 2010/0297409 A1 * | 11/2010 | Subramanian | 428/213 |

FOREIGN PATENT DOCUMENTS

| | | |
|---|---|---|
| EP | 0486489 B1 | 11/1994 |
| EP | 0412397 B1 | 3/1998 |
| EP | 0892090 A1 | 1/1999 |
| EP | 0786017 B1 | 3/1999 |
| EP | 0992603 A1 | 4/2000 |
| EP | 0944746 B1 | 7/2001 |
| EP | 1306454 A1 | 5/2003 |
| EP | 1319729 A1 | 6/2003 |
| EP | 1204776 B1 | 6/2004 |
| EP | 1790754 A1 | 5/2007 |
| EP | 1806432 A1 | 7/2007 |
| EP | 1806435 A2 | 7/2007 |
| WO | WO 9967435 A1 | 12/1999 |
| WO | WO 0044949 A1 | 8/2000 |

\* cited by examiner

*Primary Examiner* — Karl E Group

(57) ABSTRACT

There is described a Ceramic Powder, a Ceramic Layer and a Layer System of Two Pyrochlore Phases and Oxides. Besides a good thermal insulation property, thermal insulation layer systems must also have a long lifetime of the thermal insulation layer. The layer system has a ceramic layer, which comprises a mixture of two pyrochlore phases.

20 Claims, 4 Drawing Sheets

FIG 2

| Material | Chemical composition in % | | | | | | | | | | | | | |
|---|---|---|---|---|---|---|---|---|---|---|---|---|---|---|
| | C | Cr | Ni | Co | Mo | W | Ta | Nb | Al | Ti | B | Zr | Hf |
| Ni-based precision casting alloys | | | | | | | | | | | | | |
| GTD 222 | 0.10 | 22.5 | Remainder | 19.0 | | 2.0 | 1.0 | | 1.2 | 2.3 | 0.008 | | |
| IN 939 | 0.15 | 22.4 | Remainder | 19.0 | | 2.0 | 1.4 | 1.0 | 1.9 | 3.7 | 0.009 | 0.10 | |
| IN 6203 DS | 0.15 | 22.0 | Remainder | 19.0 | | 2.0 | 1.1 | 0.8 | 2.3 | 3.5 | 0.010 | 0.10 | 0.75 |
| Udimet 500 | 0.10 | 18.0 | Remainder | 18.5 | 4.0 | | | | 2.9 | 2.9 | 0.006 | 0.05 | |
| IN 738 LC | 0.10 | 16.0 | Remainder | 8.5 | 1.7 | 2.6 | 1.7 | 0.9 | 3.4 | 3.4 | 0.010 | 0.10 | |
| SC 16 | <0.01 | 16.0 | Remainder | | 3.0 | | 3.5 | | 3.5 | 3.5 | <0.005 | <0.008 | |
| Rene 80 | 0.17 | 14.0 | Remainder | 9.5 | 4.0 | 4.0 | | | 3.0 | 5.0 | 0.015 | 0.03 | |
| GTD 111 | 0.10 | 14.0 | Remainder | 9.5 | 1.5 | 3.8 | 2.8 | | 3.0 | 4.9 | 0.012 | 0.03 | |
| GTD 111 DS | | | | | | | | | | | | | |
| IN 792 CC | 0.08 | 12.5 | Remainder | 9.0 | 1.9 | 4.1 | 4.1 | | 3.4 | 3.8 | 0.015 | 0.02 | 1.00 |
| IN 792 DS | 0.08 | 12.5 | Remainder | 9.0 | 1.9 | 4.1 | 4.1 | | 3.4 | 3.8 | 0.015 | 0.02 | 1.50 |
| MAR M 002 | 0.15 | 9.0 | Remainder | 10.0 | | 10.0 | 2.5 | | 5.5 | 1.5 | 0.015 | 0.05 | 1.40 |
| MAR M 247 LC DS | 0.07 | 8.1 | Remainder | 9.2 | 0.5 | 9.5 | 3.2 | | 5.6 | 0.7 | 0.015 | 0.02 | |
| CMSX-2 | <.006 | 8.0 | Remainder | 4.6 | 0.6 | 8.0 | 6.0 | | 5.6 | 1.0 | <.003 | <.0075 | 0.10 |
| CMSX-3 | <.006 | 8.0 | Remainder | 4.6 | 0.6 | 8.0 | 6.0 | | 5.6 | 1.0 | <.003 | <.0075 | 0.10 |
| CMSX-4 | | 6.0 | Remainder | 10.0 | 0.6 | 6.0 | 6.0 | | 5.6 | 1.0 | | Re=3.0 | 0.10 |
| CMSX-6 | <.015 | 10.0 | Remainder | 5.0 | 3.0 | <.10 | 2.0 | <.10 | 4.9 | 4.8 | <.003 | <.0075 | 0.10 |
| PWA 1480 SX | <.006 | 10.0 | Remainder | 5.0 | | 4.0 | 12.0 | | 5.0 | 1.5 | <.0075 | <.0075 | |
| PWA 1483 SX | 0.07 | 12.2 | Remainder | 9.0 | 1.9 | 3.8 | 5.0 | | 3.6 | 4.2 | 0.0001 | 0.002 | |
| Co-based precision casting alloys | | | | | | | | | | | | | |
| FSX 414 | 0.25 | 29.0 | 10 | Remainder | | 7.5 | | | | | 0.010 | | |
| X 45 | 0.25 | 25.0 | 10 | Remainder | | 8.0 | | | | | 0.010 | | |
| ECY 768 | 0.65 | 24.0 | 10 | 51.7 | | 7.5 | 4.0 | | 0.25 | 0.3 | 0.010 | 0.05 | |
| MAR-M-509 | 0.65 | 24.5 | 11 | Remainder | | 7.5 | 4 | | | 0.3 | 0.010 | 0.60 | |
| CM 247 | 0.07 | 8.3 | Remainder | 10.0 | 0.5 | 9.5 | 3.2 | | 5.5 | 0.7 | | | 1.5 |

CERAMIC POWDER, CERAMIC LAYER AND LAYER SYSTEM OF TWO PYROCHLORE PHASES AND OXIDES

CROSS REFERENCE TO RELATED APPLICATIONS

The present application claims the benefit of the provisional patent application filed on May 7, 2007, and assigned application No. 60/928,087, and of European Patent Office application No. 07009114 EP filed May 7, 2007, all of the applications are incorporated by reference herein in their entirety.

FIELD OF INVENTION

The invention relates to a ceramic powder, to a ceramic layer and to a layer system of two pyrochlore phases and oxides.

BACKGROUND OF INVENTION

Such a layer system has a substrate comprising a metal alloy based on nickel or cobalt. Such products are used especially as a component of a gas turbine, in particular as gas turbine blades or heat shields. The components are exposed to a hot gas flow of aggressive combustion gases. They must therefore be able to withstand heavy thermal loads. It is furthermore necessary for these components to be oxidation- and corrosion-resistant. Especially moving components, for example gas turbine blades, but also static components, are furthermore subject to mechanical requirements. The power and efficiency of a gas turbine, in which there are components exposable to hot gas, increase with a rising operating temperature. Attempts are therefore continually being made to achieve a higher performance of gas turbines by improving the coating system.

In order to achieve a high efficiency and a high power, those gas turbine components which are particularly exposed to high temperatures are coated with a ceramic material. This acts as a thermal insulation layer between the hot gas flow and the metallic substrate.

The metallic base body is protected against the aggressive hot gas flow by coatings. In this context, modern components usually comprise a plurality of coatings which respectively fulfill specific functions. The system is therefore a multilayer system.

EP 0 944 746 B1 discloses the use of pyrochlores as a thermal insulation layer.

The use of a material as a thermal insulation layer, however, requires not only good thermal insulation properties but also good bonding to the substrate.

EP 0 992 603 A1 discloses a thermal insulation layer system of gadolinium oxide and zirconium oxide, which is not intended to have a pyrochlore structure.

SUMMARY OF INVENTION

It is therefore an object of the invention to provide a ceramic powder, a ceramic layer and a layer system having good thermal insulation properties and good bonding to the substrate and therefore a long lifetime of the overall layer system.

The object is achieved by a ceramic powder, a ceramic layer and a layer system as claimed in independent claims.

Further advantageous measures, which may advantageously be combined with one another in any desired way, are mentioned in the dependent claims.

The invention is based on the discovery that in order to achieve a long lifetime, the entire system must be considered as a whole and individual layers or some layers together should not be considered and optimized separately from one another.

The ceramic powder according to the invention and the layer system have an outer ceramic layer, which comprises a mixture of two pyrochlore phases that has particularly good thermal properties (expansion coefficient adapted to a substrate of a component, low thermal conduction coefficient) and harmonizes very well with an interlayer and a substrate of the component. Properties of the ceramic layer can be adjusted to the substrate and the interlayer through the mixing ratio of these two pyrochlore phases.

BRIEF DESCRIPTION OF THE DRAWINGS

Exemplary embodiments of the invention will be explained in more detail below with reference to the drawings, in which:
FIG. 2 shows a list of superalloys.

DETAILED DESCRIPTION OF INVENTION

Figure 1:
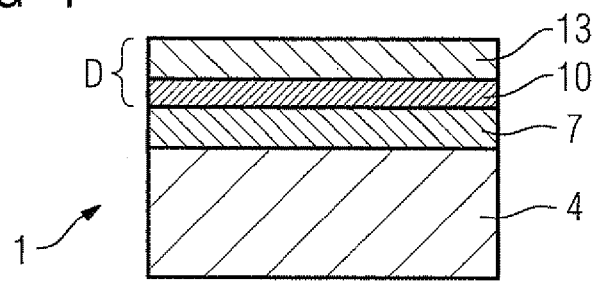
FIG. 1 shows a layer system according to the invention

The composition of the ceramic powder may also be explained with the aid of the composition of the ceramic layer 13 (FIG. 1).

According to the invention, the ceramic powder comprises two pyrochlore phases of the general empirical formula $A_xB_yO_z$ with x, y≈2, z≈7, i.e. minor defects or dopings are permissible, O=oxygen.

Examples of A are gadolinium (Gd), lanthanum (La), yttrium (Y), neodymium (Nd), ytterbium (Yb), cerium (Ce) or aluminum (Al). Examples of B hafnium (Hf), zirconium (Zr), titanium (Ti), cerium (Ce) or tin (Sn). In particular x, y=2, z=7.

The ceramic layer thus comprises a first pyrochlore $A_xB_yO_z$ and a second pyrochlore with $A'_{x'}B'_{y'}O'_{z'}$ with x', y'≈2, z'≈7, O=oxygen. In particular, x', y'=2, z'=7.

The elements A, B, A' and B' may all be different.
If A and A' are the same, then B and B' are different.
If B and B' are the same, then A and A' are different.
The combination A=A' and B=B' is excluded.
The combinations A=B', B≠A' or A'=B, A≠B' are in principle possible.

Gadolinium (Gd) is preferably used for A and/or A'.
A hafnate or a zirconate is preferably used, i.e. hafnium and/or zirconium for B, preferably gadolinium oxide (GHO), preferably $Gd_2Hf_2O_7$, and/or gadolinium zirconate (GZO), preferably $Gd_2Zr_2O_7$.

The ceramic powder or the outer ceramic layer 13 preferably comprises only two pyrochlore phases.

Gadolinium hafnate, preferably $Gd_2Hf_2O_7$, and gadolinium zirconate, preferably $Gd_2Zr_2O_7$, are preferably used.

There is preferably no mixed crystal of the two pyrochlore phases, i.e. for example no $Gd_x(Hf_yZr_w)O_z$ with x=2, y+w=2, z=7 (a mixed crystal also comprises the pyrochlore phase; there is no mixed crystal unless one is explicitly mentioned)

The proportion of the mixed crystals $A_x(B_yB'_w)O_z$, $A'(B'_rB_q)O$ or the oxides of A, B, A', B' (i.e. for example Gd, Hf, Zr) is at most 10 wt %.

The proportion of the two pyrochlore phases in the powder or in the ceramic layer is preferably at least 90 wt %.

The one pyrochlore powder with the general formula $A_2B_2O_7$ likewise comprises a secondary oxide, in particular an oxide of the element B' (or $A'_2B'_2O_7$ comprises B as oxide). The secondary oxide of B and/or B' may preferably be present as a pure oxide in the powder, or preferably only partly form a mixed crystal phase with the one pyrochlore powder.

The secondary oxide is deliberately added to the powder and is thus significantly above the metrological detection limit of the secondary oxide, i.e. it has at least two times the value of the detection limit of the secondary oxide.

Thus the gadolinium zirconate powder preferably comprises hafnium oxide, preferably with a proportion of from 0.1 wt % to 2.5 wt %.

The other pyrochlore powder, preferably gadolinium hafnate, likewise preferably comprises a secondary oxide of zirconium. The zirconium oxide may preferably be present as a pure oxide or preferably only partly also as a mixed crystal. The zirconium oxide in this case preferably has proportions of from 0.1 wt % to 7 wt %.

The two pyrochlore phases also have other optional constituents such as up to 0.05 wt % of silicon oxide, up to 0.1 wt % of calcium oxide, up to 0.1 wt % of magnesium oxide, up to 0.1 wt % of iron oxide, up to 0.1 wt % of aluminum oxide and up to 0.08 wt % of titanium oxide, which as sintering aids promote the formation of a denser layer.

Gadolinium hafnate comprises from 43 wt % to 50 wt %, preferably from 44.7 wt % to 47.7 wt % of gadolinium oxide as powder, the remainder being hafnium oxide and optionally the secondary oxides, preferably zirconium oxide (up to 7 wt %), and optionally the sintering aids.

Gadolinium zirconate comprises from 56 wt % to 63 wt %, preferably from 58 wt % to 61 wt % of gadolinium oxide as powder, the remainder being zirconium oxide and optionally the secondary oxides, preferably hafnium oxide (up to 2 wt %), and optionally the sintering aids.

These proportions of the oxides of Gd, Zr, Hf are preferably present in the powder mixture according to the ratio of Hf and Zr in the pyrochlore phases.

FIG. 1 shows a layer system according to the invention.

The layer system 1 comprises a metallic substrate 4 which, in particular for components at high temperatures, consists of a nickel- or cobalt-based superalloy (FIG. 2).

There is preferably a metallic bonding layer 7 MCrAlX directly on the substrate 4, preferably of the NiCoCrAlX type, which preferably comprises either (11-13) wt % cobalt, (20-22) wt % chromium (10.5-11.5) wt % aluminum, (0.3-0.5) wt % yttrium, (1.5-2.5) wt % rhenium and the remainder nickel, or preferably (24-26) wt % cobalt, (16-18) wt % chromium (9.5-11) wt % aluminum, (0.3-0.5) wt % yttrium, (1-1.8) wt % rhenium and the remainder nickel.

The protective layer 6 preferably consists of one of these two alloys.

An aluminum oxide layer is already formed on this metallic bonding layer 7 before further ceramic layers are applied, or such an aluminum oxide layer (TGO) is formed during operation.

There is preferably an inner ceramic layer 10, preferably a fully or partially stabilized zirconium oxide layer, on the metallic bonding layer 7 or on the aluminum oxide layer (not shown).

Yttrium-stabilized zirconium oxide (YSZ), which preferably contains from 6 wt % to 8 wt % of yttrium, is preferably used.

Calcium oxide, cerium oxide or hafnium oxide may likewise be used to stabilize zirconium oxide.

The zirconium oxide is preferably applied as a plasma-sprayed layer, although it may also preferably be applied as a columnar structure by means of electron beam deposition (EBPVD).

An outer ceramic layer 13 is then applied on the zirconium oxide layer 10, on the metallic bonding layer 7 or on the substrate 4. The layer 13 is preferably the outermost layer.

The outer ceramic layer 13 is therefore produced for example as follows: a powder consisting of two pyrochlore phases, for example gadolinium zirconate and a powder of gadolinium hafnate, are mixed together in the mixing ratio and delivered to the nozzle of a plasma spray apparatus.

Other coating methods may likewise be envisaged, for example PVD methods in which two ingots consisting of gadolinium zirconate and gadolinium hafnate are used.

The layer system 1 preferably consists of the substrate 4, a bonding layer 7 (MCrAlX), optionally a TGO and an outer single-level (for example GZO and/or GHO) or two-level thermal insulation layer 13 (YSZ and GZO or GHO).

The secondary oxide or the secondary oxides are distributed in the layer, in particular homogeneously distributed.

Any desired mixing ratios of gadolinium zirconate and gadolinium hafnate may in this case be used A larger proportion of gadolinium zirconate is preferably used. Mixing ratios of 10:90, 20:80, 30:70 or 40:60 are likewise preferably used for gadolinium hafnate to gadolinium zirconate. It is furthermore advantageous to use mixing ratios of 50:50, 60:40, 70:30, 80:20 or 90:10 for gadolinium hafnate to gadolinium zirconate.

The layer thickness of the inner layer 10 is preferably between 10% and 50% of the total layer thickness D of the inner layer 10 plus the outer layer 13 (FIG. 1).

The layer thickness of the inner layer 10 is preferably between 10% and 40% or between 10% and 30% of the total layer thickness D. It is likewise advantageous for the layer thickness of the inner layer 10 to be from 10% to 20% of the total layer thickness D. It is likewise preferable for the layer thickness of the inner layer 10 to be to be between 20% and 50% or between 20% and 40% of the total layer thickness D. Advantageous results are likewise achieved if the contribution of the inner layer 10 to the total layer thickness D is between 20% and 30%.

The layer thickness of the inner layer 10 is preferably from 30% to 50% of the total layer thickness D. It is likewise advantageous for the layer thickness of the inner layer 10 to comprise from 30% to 40% of the total layer thickness D. It is likewise preferable for the layer thickness of the inner layer 10 to be between 40% and 50% of the total layer thickness D.

The inner ceramic layer 10 preferably has a thickness of from 100 μm to 200 μm, in particular 150 μm±10%.

The total layer thickness D of the inner layer 10 plus the outer layer 13 is preferably 300 μm of preferably 450 μm. The maximum total layer thickness is advantageously 800 μm or advantageously at most 600 μm.

For short-term use with high temperatures of the layer system, the outer layer 13 may be configured to be thinner than the inner layer 10, i.e. the layer thickness of the outer layer 13 is between 10% and 40% of the total layer thickness of the inner layer 10 plus the outer layer 13.

It is preferable to use a mixture of $Gd_2Hf_2O_7$ and $Gd_2Zr_2O_7$, which are preferably mixed uniformly with one another or have a gradient. For example, there is a higher proportion of $Gd_2Zr_2O_7$ toward the hot gas side.

Figure 3:
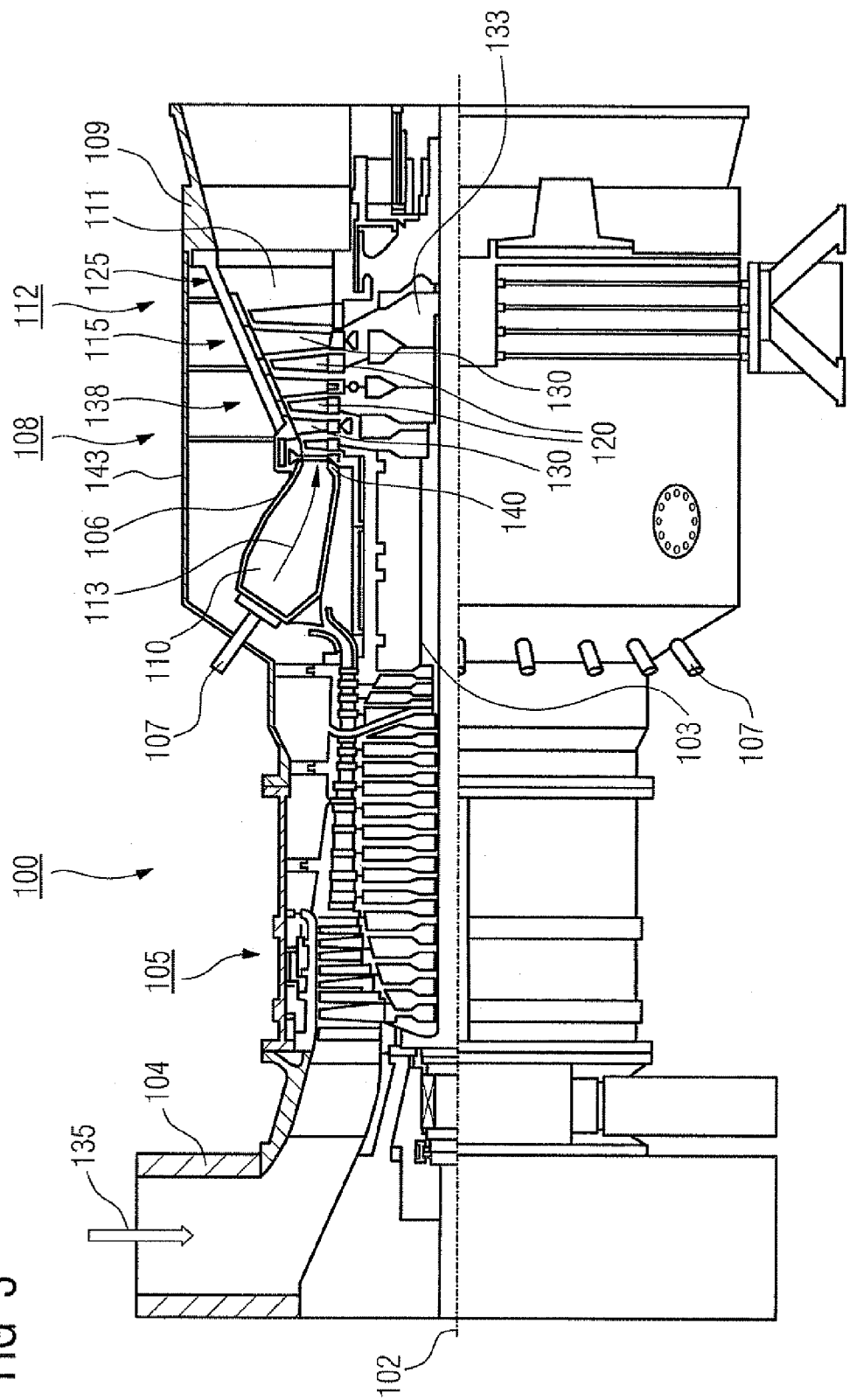
FIG. 3 shows a gas turbine.

FIG. 3 shows a gas turbine 100 by way of example in a partial longitudinal section.

The gas turbine 100 internally comprises a rotor 103 mounted so as to rotate about a rotation axis 102 and having a shaft 101, which will also be referred to as the turbine rotor.

Successively along the rotor 103, there are an intake manifold 104, a compressor 105, an e.g. toroidal combustion chamber 110, in particular a ring combustion chamber, having a plurality of burners 107 arranged coaxially, a turbine 108 and the exhaust manifold 109.

The ring combustion chamber 110 communicates with an e.g. annular hot gas channel 111. There, for example, four successively connected turbine stages 112 form the turbine 108.

Each turbine stage 112 is formed for example by two blade rings. As seen in the flow direction of a working medium 113, a guide vane row 115 is followed in the hot gas channel 111 by a row 125 formed by rotor blades 120.

The guide vanes 130 are fastened on an inner housing 138 of a stator 143 while the rotor blades 120 of a row 125 are fastened on the rotor 103, for example by means of a turbine disk 133. Coupled to the rotor 103, there is a generator or a work engine (not shown).

During operation of the gas turbine 100, air 135 is taken in by the compressor 105 through the intake manifold 104 and compressed. The compressed air provided at the turbine-side end of the compressor 105 is delivered to the burners 107 and mixed there with a fuel. The mixture is then burnt to form the working medium 113 in the combustion chamber 110. From there, the working medium 113 flows along the hot gas channel 111 past the guide vanes 130 and the rotor blades 120. At the rotor blades 120, the working medium 113 expands by imparting momentum, so that the rotor blades 120 drive the rotor 103 and the work engine coupled to it.

During operation of the gas turbine 100, the components exposed to the hot working medium 113 experience thermal loads. Apart from the heat shield elements lining the ring combustion chamber 110, the guide vanes 130 and rotor blades 120 of the first turbine stage 112, as seen in the flow direction of the working medium 113, are heated the most.

In order to withstand the temperatures prevailing there, they may be cooled by means of a coolant.

Substrates of the components may likewise comprise a directional structure, i.e. they are monocrystalline (SX structure) or comprise only longitudinally directed grains (DS structure).

Iron-, nickel- or cobalt-based superalloys are for example used as material for the components, in particular for the turbine blades 120, 130 and components of the combustion chamber 110.

Such superalloys are known for example from EP 1 204 776 B1, EP 1 306 454, EP 1 319 729 A1, WO 99/67435 or WO 00/44949.

The guide vanes 130 comprise a guide vane root (not shown here) facing the inner housing 138 of the turbine 108, and a guide vane head lying opposite the guide vane root. The guide vane head faces the rotor 103 and is fixed to a fastening ring 140 of the stator 143.

Figure 4:
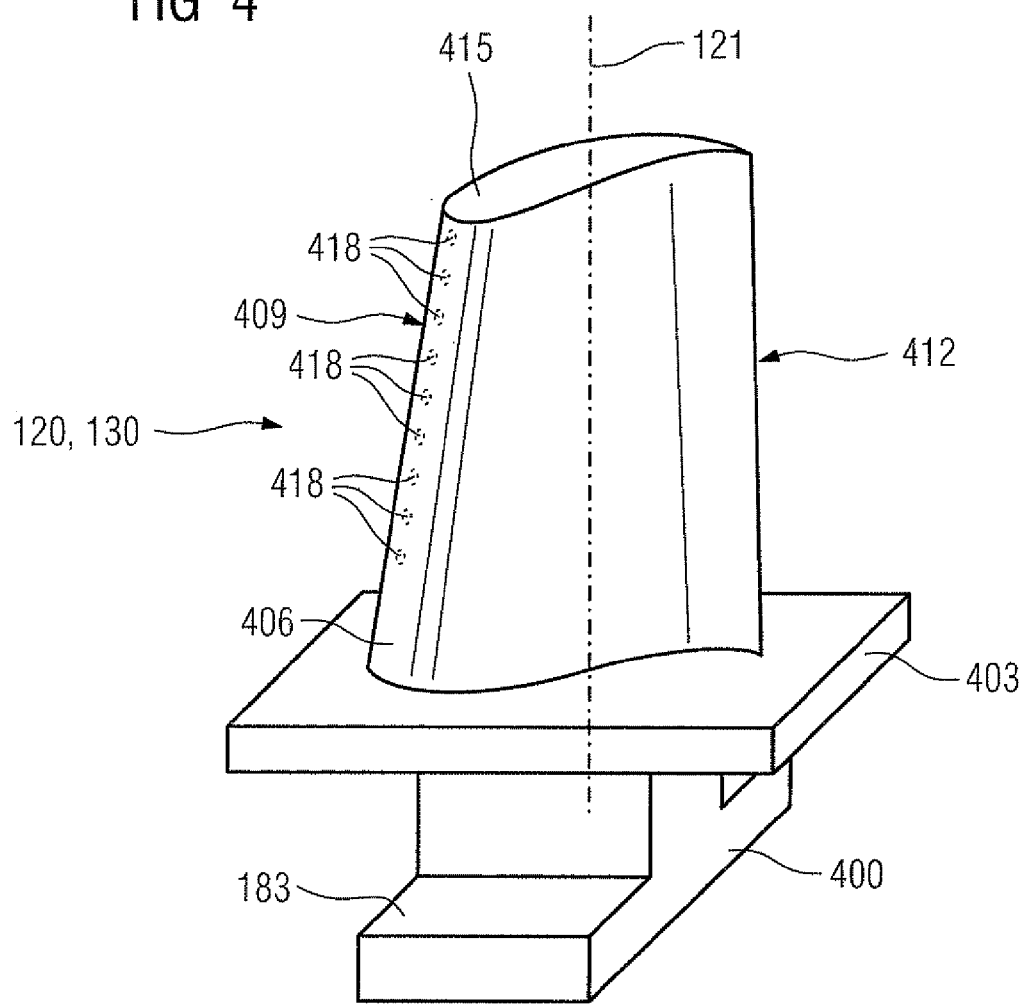
FIG. 4 shows a turbine blade in perspective.

FIG. 4 shows a perspective view of a rotor blade 120 or guide vane 130 of a turbomachine, which extends along the longitudinal axis 121. The turbomachine may be a gas turbine of an aircraft or of a power plant for electricity generation, a steam turbine or a compressor. The blade 120, 130 comprises, successively along the longitudinal axis 121, a fastening zone 400, a blade platform 403 adjacent thereto as well as a blade surface 406 and a blade tip 415. As a guide vane 130, the vane 130 may have a further platform (not shown) at its vane tip 415. A blade root 183 which is used to fasten the rotor blades 120, 130 on a shaft or a disk (not shown) is formed in the fastening region 400. The blade root 183 is configured, for example, as a hammerhead. Other configurations as a firtree or dovetail root are possible. The blade 120, 130 comprises a leading edge 409 and a trailing edge 412 for a medium which flows past the blade surface 406. In conventional blades 120, 130, for example, solid metallic materials are used in all regions 400, 403, 406 of the blade 120, 130.

Such superalloys are known for example from EP 1 204 776 B1, EP 1 306 454, EP 1 319 729 A1, WO 99/67435 or WO 00/44949.

The blades 120, 130 may in this case be manufactured by a casting method, also by means of directional solidification, by a forging method, by a machining method or combinations thereof.

Workpieces with a monocrystalline structure or structures are used as components for machines which are exposed to heavy mechanical, thermal and/or chemical loads during operation. Such monocrystalline workpieces are manufactured, for example, by directional solidification from the melts. These are casting methods in which the liquid metal alloy is solidified to form a monocrystalline structure, i.e. to form the monocrystalline workpieces, or is directionally solidified.

Dendritic crystals are in this case aligned along the heat flux and fowl either a rod crystalline grain structure (columnar, i.e. grains which extend over the entire length of the workpiece and in this case, according to general terminology usage, are referred to as directionally solidified) or a monocrystalline structure, i.e. the entire workpiece consists of a single crystal. It is necessary to avoid the transition to globulitic (monocrystalline) solidification in this method, since nondirectional growth will necessarily form transverse and longitudinal grain boundaries which negate the beneficial properties of the directionally solidified or monocrystalline component.

When directionally solidified structures are referred to in general, this is intended to mean both single crystals which have no grain boundaries or at most small-angle grain boundaries, and also rod crystal structures which, although they do have grain boundaries extending in the longitudinal direction, do not have any transverse grain boundaries. These latter crystalline structures are also referred to as directionally solidified structures.

Such methods are known from U.S. Pat. No. 6,024,792 and EP 0 892 090 A1.

The blades 120, 130 may likewise represent layer systems 1 according to the invention or have other coatings against corrosion or oxidation, for example (MCrAlX; M is at least one element from the group ion (Fe), cobalt (Co), nickel (Ni), X is an active element and stands for yttrium (Y) and/or silicon and/or at least one rare earth element, or hafnium (Hf)). Such alloys are known from EP 0 486 489 B1, EP 0 786 017 81, EP 0 412 397 B1 or EP 1 306 454 A1.

The density is preferably 95% of the theoretical density.

A protective aluminum oxide layer (TGO=thermally grown oxide layer) is formed on the MCrAlX layer (as an interlayer or as the outermost layer).

On the MCrAlX layer, there is furthermore a thermal insulation layer 13 of the layer system 1 according to the invention.

The thermal insulation layer 13 covers the entire MCrAlX layer. Rod-shaped grains are produced in the thermal insulation layer by suitable coating methods, for example electron beam deposition (EBPVD).

Other coating methods may also be envisaged, for example atmospheric plasma spraying (APS), LPPS, VPS or CVD. The thermal insulation layer may have porous, micro-cracked or macro-cracked grains for better thermal shock resistance. The thermal insulation layer is thus preferably more porous than the MCrAlX layer.

The blade 120, 130 may be designed to be a hollow or solid. If the blade 120, 130 is intended to be cooled, it will be hollow and optionally also comprise film cooling holes 418 (indicated by dashes).

Figure 5:
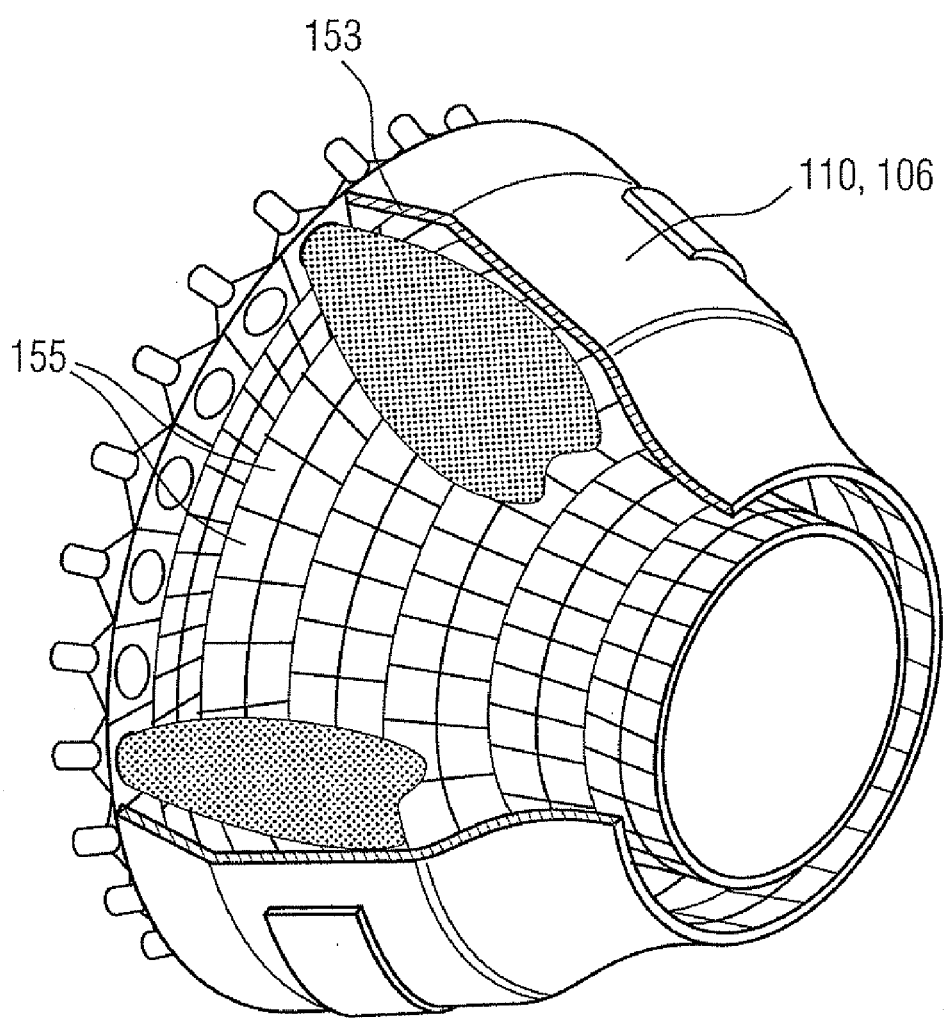
FIG. 5 shows a combustion chamber in perspective.

FIG. 5 shows a combustion chamber 110 of the gas turbine 100. The combustion chamber 110 is designed for example as a so-called ring combustion chamber in which a multiplicity of burners 107, which produce flames 156 and are arranged in the circumferential direction around a rotation axis 102, open into a common combustion chamber space 154. To this end, the combustion chamber 110 as a whole is designed as an annular structure which is positioned around the rotation axis 102.

In order to achieve a comparatively high efficiency, the combustion chamber 110 is designed for a relatively high temperature of the working medium M, i.e. about 1000° C. to 1600° C. In order to permit a comparatively long operating time even under these operating parameters which are unfavorable for the materials, the combustion chamber wall 153 is provided with an inner lining formed by heat shield elements 155 on its side facing the working medium M.

Owing to the high temperature inside the combustion chamber 110, a cooling system may also be provided for the heat shield elements 155 or for their retaining elements. The heat shield elements 155 are then hollow, for example, and optionally also have cooling holes (not shown) opening into the combustion chamber space 154.

Each heat shield element 155 is equipped with a particularly heat-resistant protective layer (MCrAlX layer and/or ceramic coating) on the working medium side, i.e. it represents the layer system 1 according to the invention, or is made of refractory material (solid ceramic blocks).

These protective layers may be similar to the turbine blades, i.e. for example MCrAlX means: M is at least one element from the group ion (Fe), cobalt (Co), nickel (Ni), X is an active element and stands for yttrium (Y) and/or silicon and/or at least one rare earth element, or hafnium (Hf). Such alloys are known from EP 0 486 489 B1, EP 0 786 017 B1, EP 0 412 397 B1 or EP 1 306 454 A1.

On the MCrAlX layer, there may furthermore be a ceramic thermal insulation layer 13 according to the invention. Rod-shaped grains are produced in the thermal insulation layer by suitable coating methods, for example electron beam deposition (EHPVD). Other coating methods may also be envisaged, for example atmospheric plasma spraying (APS), LPPS, VPS or CVD. The thermal insulation layer may have porous, micro-cracked or macro-cracked grains for better thermal shock resistance.

Refurbishment means that turbine blades 120, 130, heat shield elements 155 may need to have protective layers taken off (for example by sandblasting) after their use. Corrosion and/or oxidation layers or products are then removed. Optionally, cracks in the turbine blade 120, 130 or the heat shield element 155 are also repaired. The turbine blade 120, 130, heat shield element 155 is then recoated and the turbine blade 120, 130, heat shield element 155 is used again.

The invention claimed is:

1. A ceramic powder, consisting of:
   two pyrochlore phases;
   at least one secondary oxide; and
   at least one sintering aid.

2. A ceramic powder, comprising:
   a mixture of a first pyrochlore phase $A_xB_yO_z$ with x, y≈2, z≈7 and a second pyrochlore phase $A'_{x'}B'_{y'}O'_{z'}$ with x', y'≈2, z'≈7; and
   a secondary oxide.

3. The ceramic powder as claimed in claim 2, wherein the secondary oxide is an oxide of B or B', wherein the secondary oxide has a proportion from 0.1 wt % to 10 wt %.

4. The ceramic powder as claimed in claim 2, further comprising sintering aids selected from the group consisting of
   0.05 wt % silicon oxide,
   0.1 wt % calcium oxide,
   0.1 wt % magnesium oxide,
   0.1 wt % iron oxide,
   0.1 wt % aluminum oxide,
   0.08 wt % titanium oxide, and
   a combination thereof.

5. The ceramic powder as claimed in claim 2, wherein A is gadolinium.

6. The ceramic powder as claimed in claim 2, wherein gadolinium is used for the first and second pyrochlore phases.

7. The ceramic powder as claimed in claim 2, wherein the first pyrochlore phase is a hafnate.

8. The ceramic powder as claimed in claim 2, wherein the second pyrochlore phase is a zirconate.

9. The ceramic powder as claimed in claim 2, wherein the first pyrochlore phase is gadolinium hafnate.

10. The ceramic powder as claimed in claim 2, wherein the first pyrochlore phase is gadolinium zirconate.

11. The ceramic powder as claimed in claim 2, wherein there is a secondary oxide of B or B'.

12. The ceramic powder as claimed in claim 2, further comprising 0.1 wt % to 7 wt % of the secondary oxide.

13. The ceramic powder as claimed in claim 2, further comprising hafnium oxide.

14. The ceramic powder as claimed in claim 2, wherein zirconium oxide is the secondary oxide.

15. The ceramic powder as claimed in claim 2, wherein there are only secondary oxides of B and B', and wherein the secondary oxides of B, B' do not form a mixed crystal with one of the two pyrochlore phases.

16. The ceramic powder as claimed in claim 2, wherein there are only secondary oxides of B and B', and wherein the secondary oxides of B, B' are present only as a mixed crystal.

17. The ceramic powder as claimed in claim 2, wherein the ceramic powder comprises at most 10 wt % of a mixed crystal or has no mixed crystal.

18. The ceramic powder as claimed in claim 2, wherein a mixing weight ratio of the first and second pyrochlore phases is selected from the group consisting of
   between 30:70 and 20:80,
   between 50:50 and 40:60,
   between 70:30 and 60:40, and
   between 90:10 and 80:20.

19. The ceramic powder as claimed in claim 2, wherein the two pyrochlore phases make up at least 90 wt % of the ceramic powder.

20. The ceramic powder as claimed in claim 2, wherein x, y=2 and z=7.

* * * * *